United States Patent
Zhang et al.

(10) Patent No.: US 10,536,161 B1
(45) Date of Patent: Jan. 14, 2020

(54) NOISE SHAPING PIPELINE ANALOG TO DIGITAL CONVERTERS

(71) Applicant: Analog Devices, Inc., Norwood, MA (US)

(72) Inventors: Huajun Zhang, Quincy, MA (US); Zhichao Tan, Westford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/154,664

(22) Filed: Oct. 8, 2018

(51) Int. Cl.
*H03M 1/12* (2006.01)
*H03M 3/00* (2006.01)

(52) U.S. Cl.
CPC ........... *H03M 3/46* (2013.01); *H03M 1/1245* (2013.01); *H03M 3/424* (2013.01)

(58) Field of Classification Search
CPC ...... H03M 3/464; H03M 3/436; H03M 3/458; H03M 1/164; H03M 3/414; H03M 3/38; H03M 1/001; H03M 1/1019; H03M 1/12; H03M 3/502; H03M 3/37; H03M 3/454
USPC ........................................ 341/143, 155, 161
See application file for complete search history.

(56) References Cited

U.S. PATENT DOCUMENTS

| | | | |
|---|---|---|---|
| 5,936,562 A | 4/1999 | Brooks et al. | |
| 6,195,032 B1 * | 2/2001 | Watson ................. | H03M 1/164 341/156 |
| 6,507,305 B2 | 1/2003 | Andre et al. | |
| 6,566,158 B2 | 4/2003 | Steensguard-Madsen | |
| 6,803,870 B2 * | 10/2004 | Kuttner ................... | H03M 3/39 341/118 |
| 6,891,486 B1 * | 5/2005 | Pentakota ............. | H03M 1/109 341/120 |
| 7,002,507 B2 * | 2/2006 | Kobayashi .......... | H03M 1/1225 341/156 |
| 7,129,874 B2 | 10/2006 | Bjornsen | |
| 7,129,881 B2 * | 10/2006 | Franz .................. | H03M 1/1235 341/161 |
| 2007/0290914 A1 * | 12/2007 | Matsushita ........... | H03M 1/005 341/155 |
| 2008/0062022 A1 | 3/2008 | Melanson | |

(Continued)

OTHER PUBLICATIONS

Sarma et al., *A 250-MHz Pipelined ADC-Based fs/4 Noise-Shaping Bandpass ADC*, IEEE Transaction on Circuits and Systems—I: Regular Papers, vol. 65, No. 6, Jun. 2018, 10 pages.

(Continued)

*Primary Examiner* — Linh V Nguyen
(74) *Attorney, Agent, or Firm* — Patent Capital Group

(57) ABSTRACT

A pipeline ADC architecture with suitable feedback can implement noise shaping. By feeding back the residue generated by the last residue generating stage to selected locations in the pipeline ADC, the delays in a pipeline ADC can create a finite impulse response (FIR) filtered version of the quantization error. The FIR filtered quantization error is added to the signal and evaluated by the pipeline ADC, which results in spectral shaping of the quantization noise. Unlike a conventional pipeline ADC, the output of the backend stage is scaled and filtered by a noise transfer function (NTF) of the residue generating stages prior to combining the output with other outputs of the pipeline ADC. The processing of the shaped quantization noise by the backend stage results in further noise suppression.

20 Claims, 8 Drawing Sheets

(56) References Cited

U.S. PATENT DOCUMENTS

| | | | | |
|---|---|---|---|---|
| 2009/0073016 A1* | 3/2009 | Fattaruso | ............... | H03M 1/002 |
| | | | | 341/155 |
| 2014/0062736 A1* | 3/2014 | Nandi | ................. | H03M 1/0675 |
| | | | | 341/110 |
| 2015/0288380 A1* | 10/2015 | Zhao | ................... | H03M 1/1038 |
| | | | | 341/120 |
| 2016/0373101 A1* | 12/2016 | Dong | ........................ | H03K 5/14 |
| 2017/0353191 A1* | 12/2017 | Weng | .................... | H03M 3/326 |

OTHER PUBLICATIONS

Bannon et al., *An 18 b 5 MS/s SAR ADC with 100.2 dB Dynamic Range*, 2014 Symposium on VLSI Circuits Digest of Technical Papers, © 2014 IEEE, 2 pages.

Krishnapura, *Pipelined Analog to Digital Converters*, Department of Electrical Engineering, Indian Institute of Technology, Madras, Chennai, India, Mar. 18, 2009, 55 pages.

Rajaee et al., *Highly Linear Noise-Shaped Pipelined ADC Utilizing a Relaxed Accuracy Front-End*, IEEE Journal of Solid-State Circuits, vol. 48, No. 2, Feb. 2013, 14 pages.

\* cited by examiner

NOISE SHAPING PIPELINE ANALOG TO DIGITAL CONVERTERS

TECHNICAL FIELD OF THE DISCLOSURE

The present disclosure relates generally to analog to digital converters (ADCs) and, more particularly, to noise shaping pipeline ADCs.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an ADC as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomena, e.g., light, sound, temperature or pressure for data processing purposes. ADCs are used in a broad range of applications including Communications, Energy, Healthcare, Instrumentation and Measurement, Motor and Power Control, Industrial Automation and Aerospace/Defense. Designing an ADC is a non-trivial task because each application may have different needs in speed, performance, power, cost and size. As the applications needing ADCs grow, the need for accurate and reliable conversion performance also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
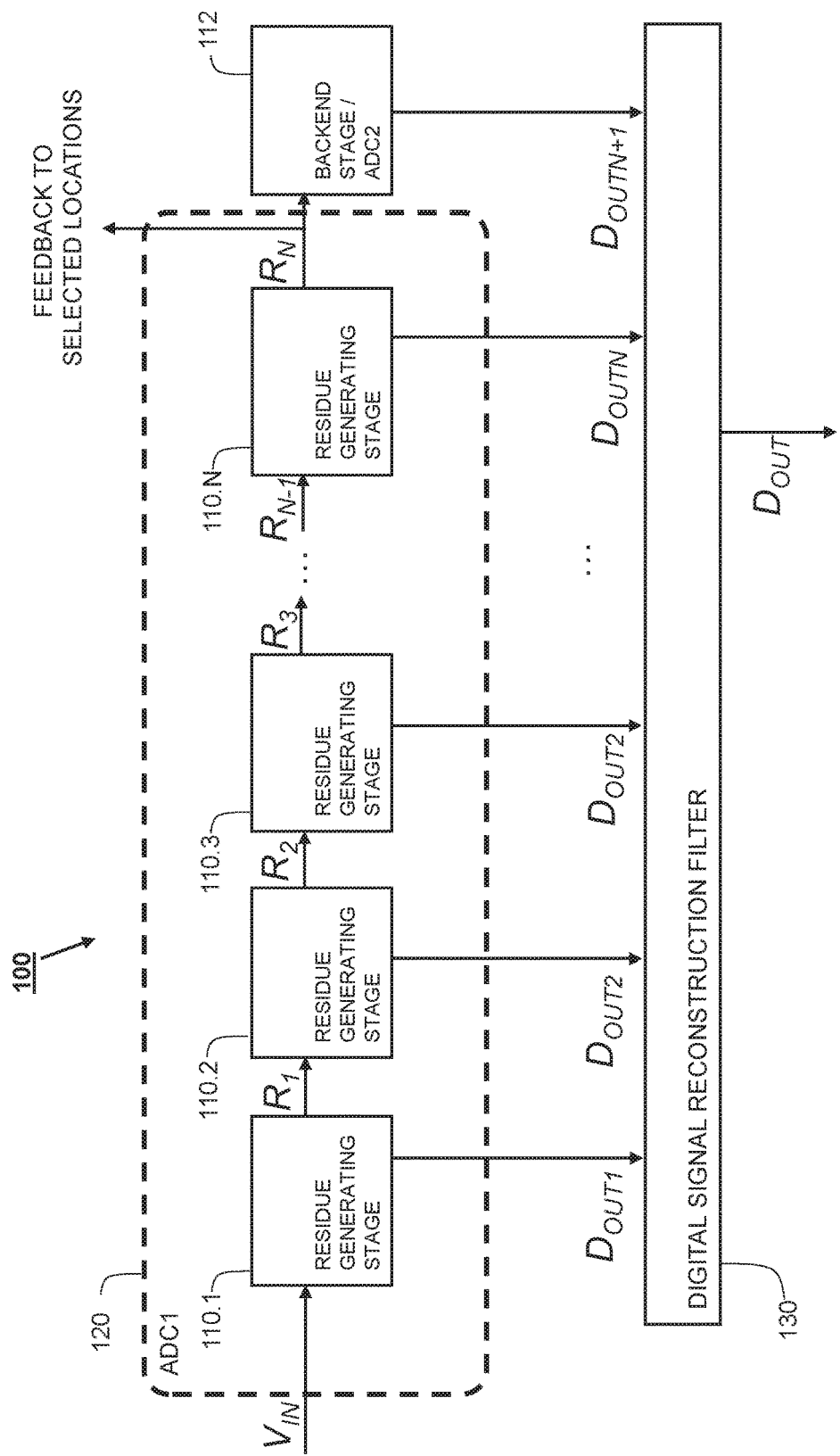
FIG. 1 is an illustrative system diagram of a noise shaping pipeline ADC, according to some embodiments of the disclosure.

A pipeline ADC architecture with suitable feedback can implement noise shaping. By feeding back the residue generated by the last residue generating stage to selected locations in the pipeline ADC, the delays in a pipeline ADC can create a finite impulse response (FIR) filtered version of the quantization error. The FIR filtered quantization error is added to the signal and evaluated by the pipeline ADC, which results in spectral shaping of the quantization noise. Unlike a conventional pipeline ADC, the output of the backend stage is scaled and filtered by a noise transfer function (NTF) of the residue generating stages prior to combining the output with other outputs of the pipeline ADC. The processing of the shaped quantization noise by the backend stage results in further noise suppression.

Designing ADCs and Certain Performance Issues in Practice

ADCs are electronic devices that convert a continuous physical quantity carried by an analog signal to a digital number that represents the quantity's amplitude (or to a digital signal carrying that digital number). The conversion involves quantization of the analog input signal, so it would introduce a small amount of error. Typically the quantization occurs through periodic sampling of the analog input signal. The result is a sequence of digital values (i.e., a digital signal) that has converted a CT and continuous-amplitude analog input signal to a discrete-time and discrete-amplitude digital signal. An ADC can be defined by the following application requirements: its bandwidth (the range of frequencies of analog signals it can properly convert to a digital signal), sampling rate (Fs, in Hertz), and its resolution (the number of discrete levels the maximum analog signal can be divided into and represented in the digital signal). An ADC also has various specifications for quantifying ADC dynamic performance, including signal-to-noise-and-distortion ratio (SINAD), effective number of bits (ENOB), signal to noise ratio (SNR), signal to quantization noise ratio (SQNR), total harmonic distortion (THD), total harmonic distortion plus noise (THD+N), and spurious free dynamic range (SFDR). ADCs have many different designs, which can be chosen based on the application requirements and performance specifications.

One flavor of ADCs is the pipeline ADC. Pipeline ADCs involve cascaded stages, where a subsequent stage would digitize an amplified residue signal from the previous stage. The amplified residue signal is generated by subtracting the analog input signal to the stage by a reconstructed analog input signal and amplifying the result from the subtraction. The reconstructed analog input signal is generated by digitizing the analog input signal to the stage to generate a digital output, and generating the reconstructed analog input signal based on the digital output. The cascaded stages offer pipelining, which enables pipeline ADCs to achieve reasonably high resolution at a relatively high speed. Pipeline ADCs are can have resolutions of up to 14 bits and sampling rates over 100 MHz and even to the Gigahertz range. They are ideal for many applications that require not only high sampling rates but high SNR and SFDR. An exemplary application for pipeline ADCs is in communications, such as software-defined radios (SDR) that are often used in cellular telephone base stations.

Certain factors may limit the bandwidth of pipeline ADCs. For instance, pipeline ADCs often operate with an oversampling ratio (OSR) that is greater than 1 to improve its performance, e.g., to increase the SNR. Also, because of the finite roll-off of a preceding anti-aliasing filter, the signal cannot extend to the Nyquist frequency of Fs/2.

In many communication applications, the signal of interest is often a narrowband signal centered around an intermediate frequency (IF). In many other applications (e.g. sensors and healthcare), the signal of interest are around or near DC. For a wide range of applications, it may be desirable to enhance the SQNR of the ADC by pushing some quantization noise energy out of the signal band of interest. Accordingly, high pass noise shaping can be beneficial in these applications where noise shaping can effectively push the quantization noise of the pipeline ADC to higher frequencies or out of band.

Noise Shaping Pipeline ADC with One or More Feedback Paths

FIG. 1 is an illustrative system diagram of a noise shaping pipeline ADC 100, according to some embodiments of the disclosure. The noise shaping pipeline ADC 100 includes a plurality stages connected in series, in pipeline, or in cascading configuration. Specifically, the noise shaping pipeline ADC has N (number of) residue generating stages, shown as residue generating stage 110.1, residue generating stage 110.2, . . . , and residue generating stage 110.N. Collectively, the N residue generating stages make up a first ADC (ADC1) 120. The noise shaping pipeline ADC 100 further includes a second ADC (ADC2) 112. The second ADC 112 digitizes an amplified residue signal from the $N^{th}$ residue generating stage 110.N. The second ADC 112 also referred to as a backend stage or the backend ADC.

N can be greater than or equal to 2. N can vary depending on the design of the noise shaping pipeline ADC 100.

Each stage (a residue generating stage or the backend stage) can receive a respective analog input signal and generate a respective digital output signal. If a stage is a residue generating stage, then the stage also generates an amplified residue signal (an analog output signal). The digital output signal of a stage is generated through quantization, digitization, or analog to digital conversion of the analog input signal of a stage. A residue generating stage can form the amplified residue signal through summation/subtraction of the analog input signal and a reconstructed analog input signal of the stage. The residue generating stage can form a reconstructed analog input signal of the stage by converting the digital output signal back into an analog signal.

Referring back to FIG. 1, a first residue generating stage 110.1 receives an analog input signal of the noise shaping pipeline ADC 100, $V_{IN}$, and generates a digital output signal $D_{OUT1}$ and an amplified residue signal $R_1$. The second residue generating stage 110.2 receives an amplified residue signal $R_1$ from the first residue generating stage 110.1 as its analog input signal, and generates a digital output signal $D_{OUT2}$ and an amplified residue signal $R_2$. The third residue generating stage 110.3 receives an amplified residue signal $R_2$ from the second residue generating stage 110.1 as its analog input signal, and generates a digital output signal $D_{OUT3}$ and an amplified residue signal $R_3$, and so on. The last, or $N^{th}$, residue generating stage 110.N receives an amplified residue signal $R_{N-1}$ from the $N-1^{th}$ residue generating stage 110.N-1 as its analog input signal, and generates a digital output signal $D_{OUTN}$ and an amplified residue signal $R_N$. The second ADC 112 receives an amplified residue signal $R_N$ from the $N^{th}$ residue generating stage 110.N as its analog input signal, and generates a digital output signal $D_{OUTN+1}$ (no amplified residue signal is generated).

Digital output signals, $D_{OUT1}$, $D_{OUT2}$, $D_{OUT3}$, . . . , $D_{OUTN}$, and $D_{OUTN+1}$ from the stages (i.e., the N residue generating stages 110.1-110.N and the second ADC 112) are filtered and combined in the digital domain by a digital signal reconstruction filter 130 to form a final digital output signal $D_{OUT}$ of the noise shaping pipeline ADC 100. The final digital output signal $D_{OUT}$ is thus a digital version of the analog input signal $V_{IN}$.

The stages can have the same number of bits for digital resolution, or the stages can have different numbers of bits for digital resolution. Resolution of the stages can depend on the design.

To implement noise shaping, the amplified residue signal $R_N$ from the $N^{th}$/last residue generating stage 110.N is fed back to selected locations of the first ADC 120. Specifically, the noise shaping pipeline ADC 100 includes the one or more feedback paths. Selecting the selected locations for feedback and designing the feedback paths to achieve noise shaping are not trivial tasks.

Figure 2:
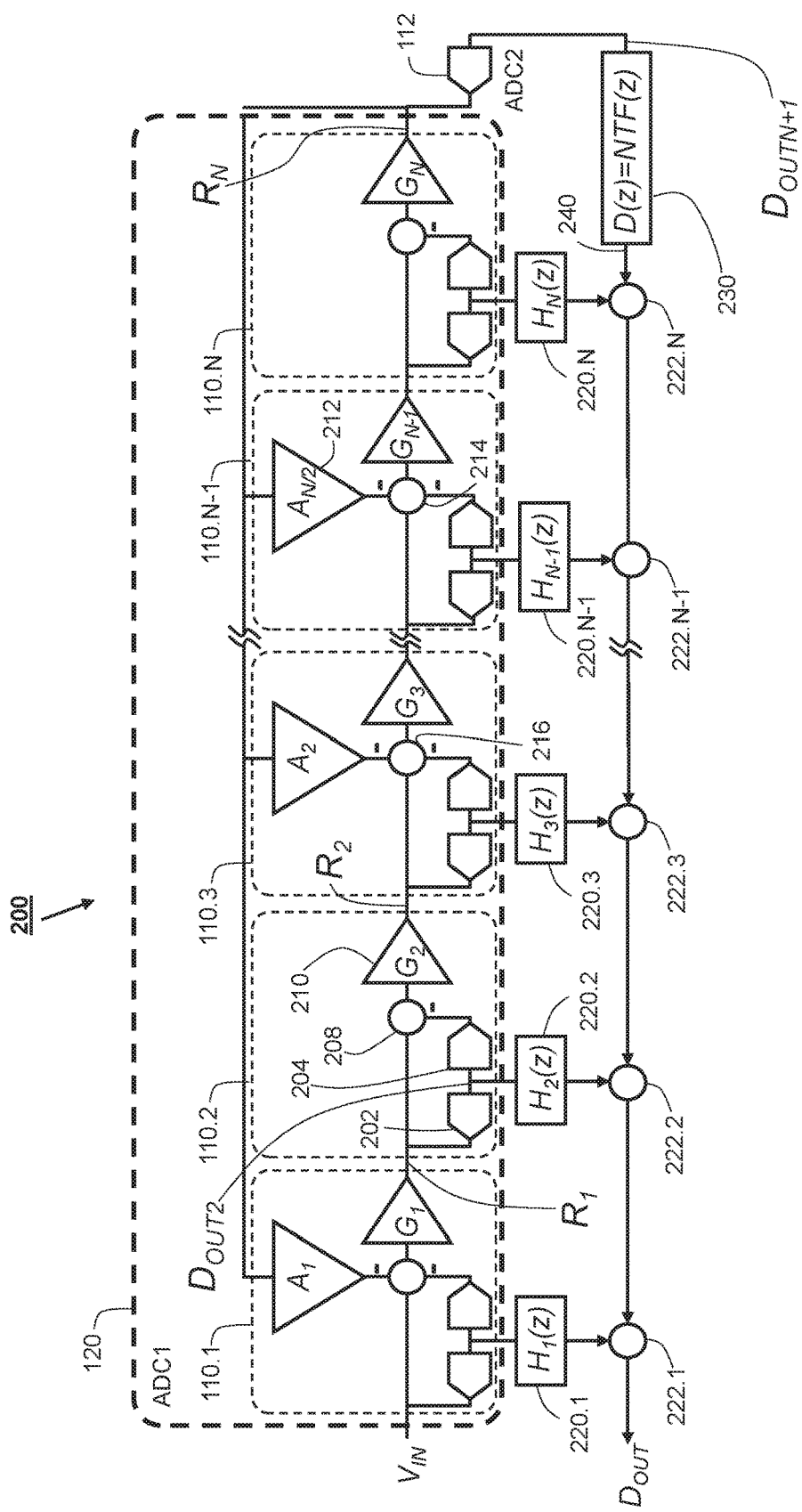
FIG. 2 shows a circuit architecture of a noise shaping pipeline ADC, according to some embodiments of the disclosure.

FIG. 2 shows a circuit architecture of a noise shaping pipeline ADC 200, according to some embodiments of the disclosure. As illustrated by FIG. 1, the noise shaping pipeline ADC 200 has a first ADC 120 and a second ADC 112. The first ADC 120 has N residue generating stages 110.1-110.N. Each residue generating stage has an ADC to generate a digital output signal based on an analog input signal of the residue generating stage. Each residue generating stage also has a multiplying digital to analog converter (MDAC) to reconstruct the input signal based on the digital output signal, determine a difference between the reconstructed input signal and the input signal, and amplify the difference. Looking at the second residue generating stage 110.2 as an example, the second residue generating stage 110.2 has an ADC 202, and an MDAC formed by DAC 204, summation/subtraction node 208, and amplifier 210. The ADC 202 quantizes the analog input signal to the second residue generating stage 110.2 (which is the amplified residue signal from the first residue generating stage 110.1, $R_1$), and generates a digital output signal $D_{OUT2}$. The DAC 204 converts the digital output signal $D_{OUT2}$ into analog form to reconstruct the input signal to the stage. The summation/subtraction node 208 can subtract the analog input signal by the reconstructed input signal to form the difference. The amplifier 210 can amplify the difference. The amplifier 210 implements an interstage gain for the second residue generating stage 110.2 before passing the amplified residue signal $R_2$ onto the third residue generating stage 110.3. The actual circuitry to implement the MDAC of a residue generating stage can vary depending on the circuit design. Other residue generating stages can be implemented in a similar fashion.

Each residue generating stage has a stage resolution of Bi-bits, where i is an integer between 1 and N. The second ADC 112 can have a resolution of C-bits. Interstage gain values implemented by the residue generating stages are denoted as $G_i$'s (e.g., $G_1$, $G_2$, . . . $G_N$), where i is an integer between 1 and N. A delay (an implicit delay) of half a cycle is assumed for each residue generating stage and the backend stage.

For the N residue generating stages of first ADC 120, digital filters (e.g., $H_1(z)$ 220.1, $H_2(z)$ 220.2, $H_3(z)$ 220.3, . . . , $H_{N-1}(z)$ 220.N-1, and $H_N(z)$ 220.N) can be included in the digital signal reconstruction filter to filter corresponding digital output signals (e.g., $D_{OUT1}$-$D_{OUTN}$) from the N residue regenerating stages 110.1-110.N. The filtered digital output signals from the digital filters $H_1(z)$-$H_N(z)$ (corresponding to the digital output signals of the N residue generating stages 110.1-110.N) are summed/combined by summation nodes 222.1-222.N of the digital signal reconstruction filter to generate a final digital output $D_{OUT}$.

As discussed previously, noise shaping can be achieved by implementing feedback to one or more selected locations in the first ADC 120. With appropriate feedback path(s) provided to feedback the amplified residue signal from the $N^{th}$ residue generating stage 110.N, it is possible to realize a desired NTF in the first ADC 120. As a general case, the one or more feedback paths comprises a feedback path to feed the amplified residue signal $R_N$ from the $N^{th}$ residue generating stage to an MDAC (e.g., a summation node of the MDAC) in the N-$k^{th}$ residue generating stage. k is an odd number greater than or equal to 1. Feedback paths can be provided to every other residue generating stage counting from the N-$1^{th}$ residue generating stage forward, e.g., N-$1^{th}$ residue generating stage, N-$3^{th}$ residue generating stage, N-$5^{th}$ residue generating stage, and so on. Feedback paths can implement corresponding gain values, which is denoted as $A_1, A_2, \ldots$, and $A_{N/2}$.

A first feedback path can feed the amplified residue signal $R_N$ from the $N^{th}$/last residue generating stage 110.N to an MDAC in the N-$1^{th}$ residue generating stage. This first feedback path is shown as the path feeding $R_N$ to the MDAC, i.e., a summation node 214, of the N-1th residue generating stage. More feedback paths can be included for k greater than or equal to 3. A further feedback path feed the amplified residue signal $R_N$ from the $N^{th}$/last residue generating stage 110.N to an MDAC in the N-$k^{th}$ residue generating stage. For instance, a second feedback path can feed the amplified residue signal $R_N$ from the $N^{th}$/last residue generating stage 110.N to an MDAC in the N-$3^{th}$ residue generating stage. In the example shown in FIG. 2, N is even, and feedback paths are provided to MDACs of N-$1^{th}$ residue generating stage, N-$3^{th}$ residue generating stage, . . . , and first residue generating stage 110.1. In some cases, N is odd, and feedback paths are provided to MDACs of N-$1^{th}$ residue generating stage, N-$3^{th}$ residue generating stage, . . . , and the second residue generating stage 110.2.

Generally speaking, the selected location(s), L, can be defined as follows, where L indicates which $L^{th}$ residue generating stage receives the amplified feedback residue signal $R_N$ from the $N^{th}$/last residue generating stage 110.N:

$$L=N-k, k=1,3,5,\ldots \qquad \text{(Equation 1)}$$

N, the number of residue generating stages, is greater than or equal to 2. k is odd and equal to greater than 1. L is greater than or equal to 1.

k is odd due each residue generating stage introducing a half-cycle delay. The feedback of the amplified residue signal $R_N$ from the $N^{th}$/last residue generating stage 110.N is applied when the MDAC of the $N^{th}$/last residue generating stage 110.N is in amplification and the L=N-$k^{th}$ residue generating stages are sampling.

The feedback paths do not have to be implemented for all possible values of L=N-k, e.g., L does not have to always include 1 or 2. The following outlines several examples for L:

For a noise shaping pipeline ADC having N=3 residue generating stages and a backend stage, the feedback paths can feed the residue signal generated by the $3^{th}$ residue generating stage to MDAC of the $2^{nd}$ stage (N-$1^{th}$). No feedback to the MDAC of the $1^{st}$ stage.

For a noise shaping pipeline ADC having N=4 residue generating stages and a backend stage, the feedback paths can feed the residue signal generated by the $4^{th}$ residue generating stage to MDACs of the $3^{rd}$ stage (N-$1^{th}$), and $1^{st}$ stage (N-$3^{th}$). No feedback is provided to the MDAC of the $2^{nd}$ stage.

For a noise shaping pipeline ADC having N=5 residue generating stages and a backend stage, the feedback paths can feed the residue signal generated by the $5^{th}$ residue generating stage to MDACs of the $4^{th}$ stage (N-$1^{th}$), and $2^{nd}$ stage (N-$3^{th}$). No feedback is provided to the MDACs of the $3^{rd}$ stage, and the $1^{st}$ stage.

For a noise shaping pipeline ADC having N=6 residue generating stages and a backend stage, the feedback paths can feed the residue signal generated by the $6^{th}$ residue generating stage to MDACs of the 5th stage (N-$1^{th}$), $3^{rd}$ stage (N-$3^{th}$), and $1^{st}$ stage (N-$5^{th}$). No feedback is provided to the MDACs of the 4th stage, and the $2^{nd}$ stage.

For a noise shaping pipeline ADC having N=10 residue generating stages and a backend stage, the feedback paths can feed the residue signal generated by the $10^{th}$ residue generating stage to MDACs of the $9^{th}$ stage (N-$1^{th}$), $7^{th}$ stage (N-$3^{th}$), and $5^{th}$ stage (N-$5^{th}$). No feedback is provided to the MDACs of the $8^{th}$ stage, $6^{th}$ stage, $4^{th}$ stage, $3^{rd}$ stage, $2^{nd}$ stage, and $1^{st}$ stage.

Noise Processing in the First ADC and the Second ADC

Advantageously, the feedback paths together with the delays inherent in the residue generating stages of the first ADC 120 can act as taps of an FIR filter, and produce a FIR filtered version of the quantization error of the first ADC 120. An FIR filter can have a response in the form of $b_0+b_1z^{-1}+b_2z^{-2}+\ldots+b_{N/2}z^{-N/2}$. The FIR filtered quantization error is added to the signal through feedback and evaluated by N residue generating stages 110.1-110.N, which results in spectral shaping of the quantization noise. Specifically, the feedback paths enables a desired NTF, of the order of floor(N/2) to be realized in the first ADC 120. N can dictate the highest achievable NTF order based on these feedback paths, i.e., equal to floor(N/2). Higher order NTF can achieve in higher order spectral noise shaping. The amount of achievable noise shaping can in turn affect the overall SQNR of the noise shaping pipeline ADC, along with other ADC design parameters such as OSR and the resolution in each residue generating stage and the backend stage.

With the feedback paths as discussed with FIG. 2, the first ADC 120 can implement error feedback to carry out noise shaping. The NTF of the first ADC 120, NTF(z), with the feedback paths illustrated by FIG. 2, can be represented by the form:

$$NTF(z)=b_0+b_1z^{-1}+b_2z^{-2}+\ldots+b_{N/2}z^{-N/2}/(G_1G_2\ldots G_N) \qquad \text{(Equation 2)}$$

$b_0, b_1, \ldots$ and $b_{N/2}$ are filter coefficients implemented by the feedback paths in the first ADC 120. $G_1, G_2, \ldots G_N$ are the interstage gains of the N residue generating stages. The feedback paths can advantageously shape and suppress the noise in the first ADC 120, based on the filter coefficients and interstage gain values chosen for the first ADC 120. As seen in Equation 2, the noise transfer function of the first ADC 120, NTF(z), has a component of a filter implemented by the feedback paths in the numerator and a component of the interstage gains of the N residue generating stages in the denominator.

Specifically, the desired filter coefficients, $b_0, b_1, \ldots$ and $b_{N/2}$, can be selected to realize a particular response (e.g., a high pass response, a low pass response, a bandpass response, notch filter response, etc.) to suppress unwanted quantization noise. In some embodiments, $b_0$, is equal to one. To implement the filter coefficients of Equation 2, e.g., select coefficients $b_1, b_2, \ldots$ and $b_{N/2}$ in the first ADC 120, the gain values corresponding to the feedback paths, $A_i$, can be given by:

$$A_1 = b_{N/2}/(G_N G_{N-1} \ldots G_1) \qquad \text{(Equation 3.1)}$$

$$A_2 = b_{N/2-1}/(G_N G_{N-1} \ldots G_3) \qquad \text{(Equation 3.2)}$$

$$A_{N/2} = b_1/(G_N G_{N-1}) \qquad \text{(Equation 3.N/2)}$$

As illustrated in Equations 3.1-3.N/2, gain value(s) of the at least one feedback paths can be selected to implement a predefined NTF(z) of the N residue generating stages in the first ADC 120. Specifically, the gain value(s) can affect filter coefficients $b_1, b_2, \ldots$ and $b_{N/2}$ of the NTF(z). Moreover, the gain value(s) can be tuned to change the NTF(z) of the N residue generating stages (as seen in Equation 2).

Cancellation of the shaped quantization noise of the first ADC 120 can be achieved by appropriately processing the quantization error of the N residue generating stages 110.1-110.N prior to combining all the digital output signals to form a final digital output signal. Specifically, the quantization error, which is available as the amplified residue signal at the $N_{th}$/last residue generating stage 110.N, is digitized by a second ADC 112. The digital output signal $D_{OUTN+1}$ of the second ADC 112 is filtered by a digital filter 230 of FIG. 2, prior to combining a filtered digital output signal 240 of the digital filter 230 with other digital output signals (e.g., outputs of filters $H_1(z)$ 220.1-$H_N(z)$ 220.N). The digital filter 230 can filter the digital output signal $D_{OUTN+1}$ of the second ADC 112 by the NTF(z) of the first ADC 120 (i.e., NTF(z) as seen in Equation 2).

The implementation of the digital filter 230 to perform cancellation of the shaped quantization noise of the first ADC 120 is not trivial. The digital filter 230 is implemented to correspond to a noise transfer function of the N residue generating stages, e.g., the NTF(z) in Equation 2. Specifically, the digital filter 230 can have a component of a filter implemented by the feedback paths in the numerator of the transfer function of the digital filter 230. The digital filter 230 can scale the digital output signal of the second ADC 112. Specifically, the digital filter 230 can have a component of the interstage gains of the N residue generating stages in the denominator of the transfer function of the digital filter 230. For instance, digital filter 230 scales the digital output signal of the backend stage according to interstage gains (e.g., $G_1, G_2, \ldots G_N$) of the N residue generating stages 110.1-110.N. The filtered digital output signals from the digital filters $H_1(z)$-$H_N(z)$ (corresponding to the digital output signals of the N residue generating stages 110.1-110.N) and the filtered digital output signal 240 are summed/combined by summation nodes 222.1-222.N of the digital signal reconstruction filter to generate a final digital output $D_{OUT}$. An exemplary transfer function of the digital filter 230, D(z), which corresponds to the noise transfer function of the first ADC 120, i.e., NTF(z) of Equation 2, is thus:

$$D(z) = NTF(z) = b_0 + b_1 z^{-1} + b_2 z^{-2} + \ldots + b_{N/2} z^{-N/2}/(G_1 G_2 \ldots G_N) \qquad \text{(Equation 4)}$$

As seen above in Equation 4, the transfer function of the digital filter 230, D(z), corresponds to the NTF(z) of the first ADC 120 having the feedback paths illustrated in FIG. 2 seen in Equation 2. In other words, the digital filter 230 is programmed to match the NTF(z) of the first ADC 120 having the feedback paths. Accordingly, just as the same NTF(z) of the first ADC 120, the transfer function D(z) of the digital filter 230 has a component of a filter implemented by the feedback paths in the numerator and a component of the interstage gains of the N residue generating stages in the denominator. If the filter coefficients, i.e., the gain values of the feedback paths, are tuned to change the NTF(z) of the first ADC 120, the transfer function of the digital filter 230 would be updated accordingly.

Figure 3:
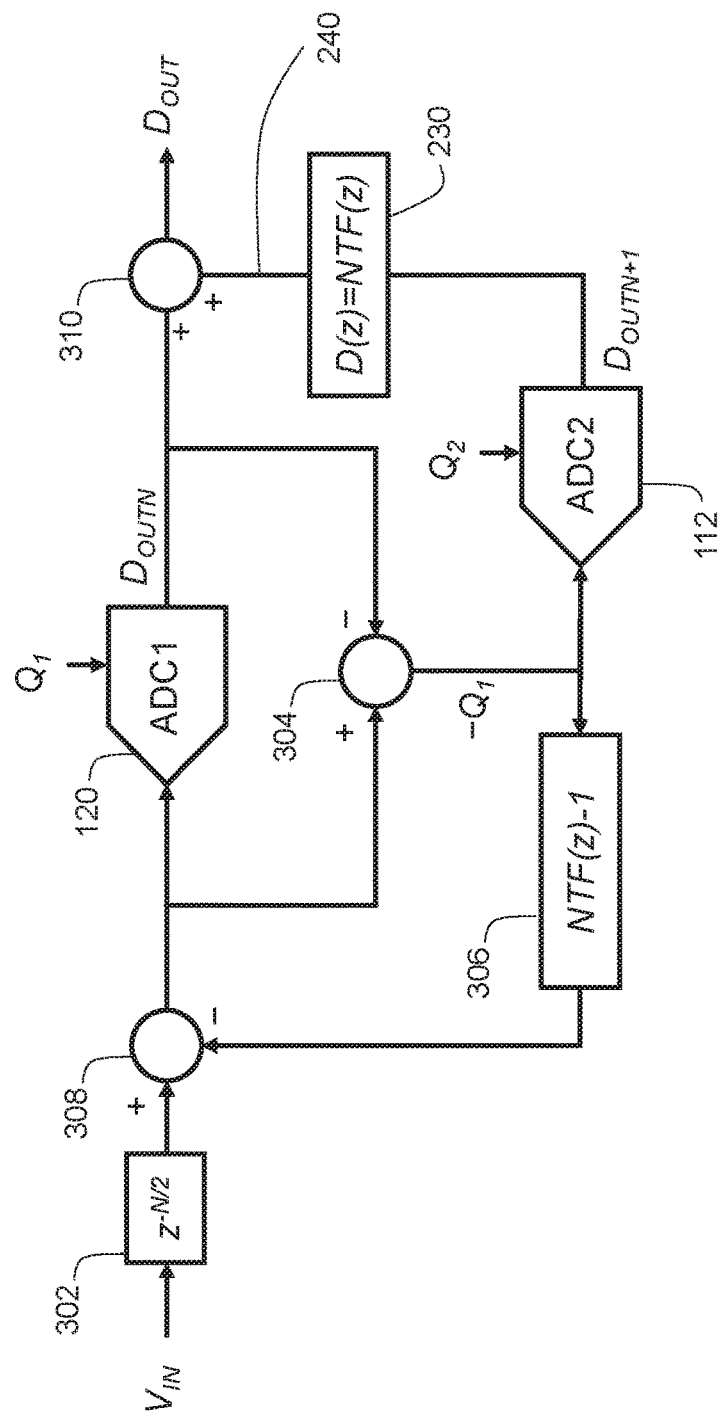
FIG. 3 illustrates signal processing by a first ADC and a second ADC, according to some embodiments of the disclosure.

Advantageously, the second ADC 112 and the digital filter 230 together enable the cancelling of the quantization noise of the N residue generating stages 110.1-110.N. To understand noise shaping in the first ADC 120 and cancellation of the shaped quantization noise of the first ADC 120, FIG. 3 illustrates signal processing by a first ADC 120 and a second ADC 112, according to some embodiments of the disclosure. For N residue generating stages (each having half a cycle delay) in the first ADC 120, the output of the N residue generating stages $D_{OUTN}$ is equal to the input $V_{IN}$ delayed by delay 402 (represented by $z^{-N/2}$) and the quantization error $Q_1$ introduced by the first ADC 120.

The quantization error $Q_1$ introduced by the first ADC 120 is readily available at the output of the Nth/last residue generating stage as $-Q_1$. The quantization error $-Q_1$ is generated by the MDAC of the Nth/last residue generating stage, and is represented by the node 304 which subtracts the input to the first ADC 120 by the digital output signal $D_{OUTN}$. The quantization error $-Q_1$ passes through an FIR filter 306 (created by the feedback paths and inherent delays in the first ADC 120) with a response equal to NTF(z)-1, and the filtered quantization error, (NTF(z)-1)(-$Q_1$), is subtracted from the delayed input signal $z^{-N/2}V_{IN}$ at node 308 as error feedback. As a result, in the digital output signal $D_{OUTN}$ of the first ADC 120, $Q_1$ appears shaped by 1+(NTF(z)-1)=NTF(z), that is:

$$D_{OUTN} = z^{-N/2} V_{IN} + NTF(z) Q_1 \qquad \text{(Equation 5)}$$

The second ADC 112 (i.e., the backend ADC or the backend stage) digitizes $-Q_1$, and introduces quantization error $Q_2$ in the process. Accordingly, the digital output signal $D_{OUTN+1}$ of the second ADC 112 is as follows:

$$D_{OUTN+1} = -Q_1 + Q_2 \qquad \text{(Equation 6)}$$

The digital output signal $D_{OUTN+1}$ of the second ADC 112 is filtered by a digital filter 230, having a transfer function D(z) corresponding to NTF(z) of the first ADC 120 (defined in Equation 4), e.g., as part of the digital signal reconstruction filter, to generate a filtered digital output signal 240 of the second ADC 112. The digital output signal $D_{OUTN}$ of the first ADC 120 and the filtered digital output signal 240 are combined by node 310 in the digital signal reconstruction filter. A final digital output signal $D_{OUT}$ of the noise shaping pipeline ADC is thus:

$$D_{OUT} = D_{OUTN} + NTF(z) D_{OUTN+1} = z^{-N/2} V_{IN} + NTF(z) Q_1 + NTF(z)(-Q_1 + Q_2) = z^{-N/2} V_{IN} + NTF(z) Q_2 \qquad \text{(Equation 7)}$$

In words, the final digital output signal $D_{OUT}$ of the noise shaping pipeline ADC has the delayed input signal $z^{-N/2}V_{IN}$ and a quantization error $Q_2$ of the second ADC 112 shaped by NTF(z). As seen in Equation 7, the term for NTF(z)$Q_1$ falls out. Cancellation can be achieved provided that the actual NTF of the first ADC 120 and interstage gains are accurately characterized in the digital filter 230 (which can be done easily for discrete-time circuits). Effectively, the second ADC 112 and the digital filter 230 enable the digital cancellation of the quantization error $Q_1$ of the first ADC 120. The second ADC 112 and the digital filter 230 can allow the noise shaping pipeline ADC to achieve higher resolution at lower OSR, because the SQNR is improved.

The quantization error $Q_Z$ of the second ADC 112, shaped by NTF(z), is leaked into the final digital output signal $D_{OUT}$. In practice, $Q_2$ can be made much smaller than $Q_1$ because it is typical for the second ADC 112 (the backend stage) to have higher resolution. Gain from the Nth/last residue generating stage can also reduce the impact of $Q_2$.

In some embodiments, further noise shaping can shape/suppress $Q_2$ further by implementing the second ADC 112 with a noise shaping ADC. For example, the second ADC 112 can be a delta sigma modulator, with a corresponding noise transfer function $NTF_{ADC2}(z)$. The noise transfer function $NTF_{ADC2}(z)$ can further shape the quantization error $Q_2$ of the second ADC 112 to suppress quantization error $Q_2$ leaked in the final digital output signal $D_{OUT}$.

Accordingly, the digital output signal $D_{OUTN+1}$ of the second ADC 112 becomes:

$$D_{OUTN+1} = -Q_1 + NTF_{ADC2}(Z)Q_2 \quad \text{(Equation 8)}$$

As a result, the final digital output signal $D_{OUT}$ of the noise shaping pipeline ADC becomes:

$$D_{OUT} = D_{OUTN} + NTF(z)D_{OUTN+1} = z^{-N/2}V_{IN} + NTF(z)$$
$$Q_1 + NTF(z)(-Q_1 + NTF_{ADC2}(Z)Q_2) = z^{-N/2}V_{IN} +$$
$$NTF(Z)NTF_{ADC2}(Z)Q_2 \quad \text{(Equation 9)}$$

The quantization error $Q_2$ of the second ADC 112, shaped by NTF(z) and $NTF_{ADC2}(z)$, is leaked into the final digital output signal $D_{OUT}$. Accordingly, quantization error $Q_2$ of the second ADC 112 is suppressed even further.

Figure 4:
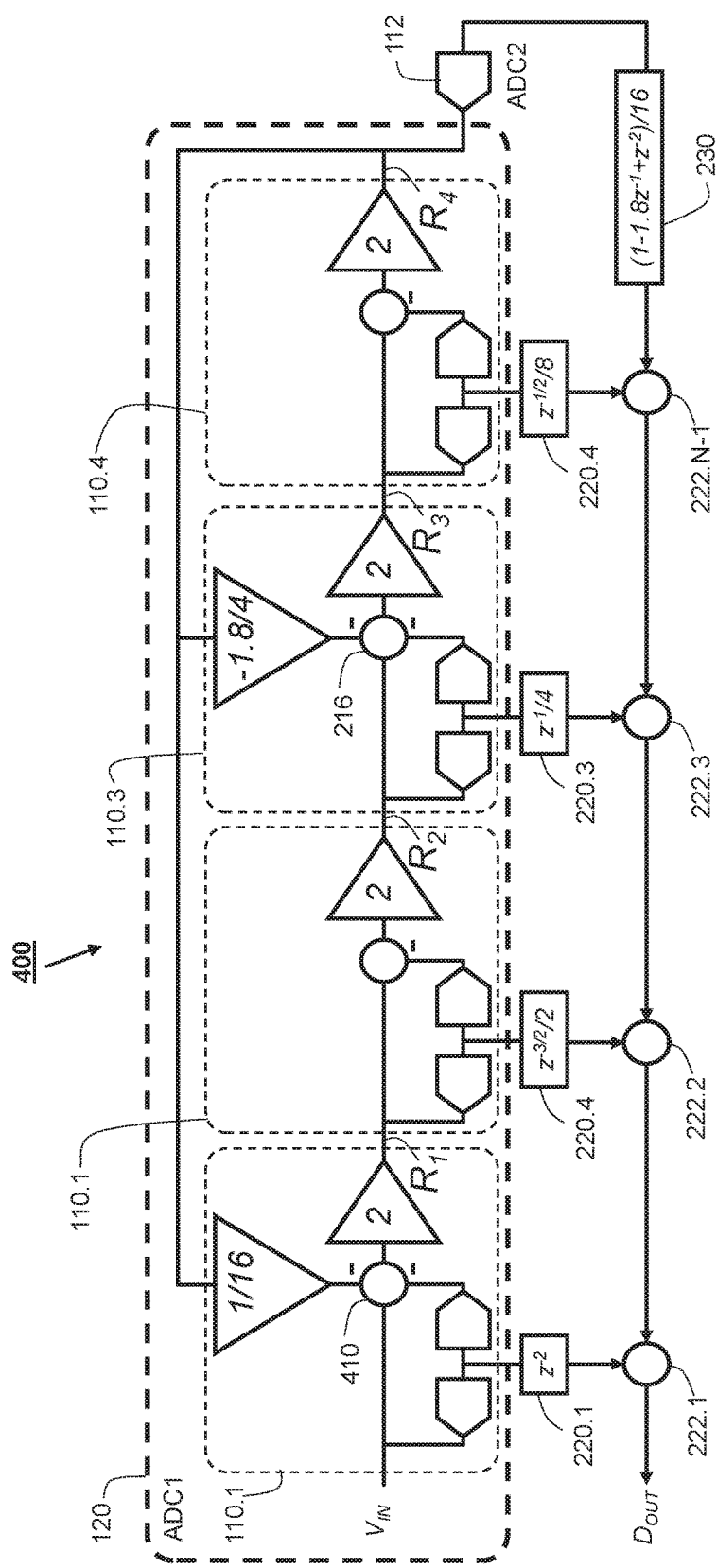
FIG. 4 shows an exemplary implementation of a noise shaping pipeline ADC, according to some embodiments of the disclosure.

Example of Noise Shaping Pipeline ADC Having 4 Residue Generating Stages and a Backend Stage FIG. 4 shows an exemplary implementation of a noise shaping pipeline ADC 400, according to some embodiments of the disclosure. The noise shaping pipeline ADC has N=4 residue generating stages 110.1-110.4 and a second ADC 112 (the backend stage). Each residue generating stage has a 2-bit flash ADC. Interstage gains are set to 2 for error correction, which also reduces the output swing requirements of the amplifiers, and leaves room for the feedback residue signal. The second ADC 112 is a 4-bit flash ADC. The resolution of the pipeline ADC without error feedback is, therefore, 2+1+1+1+3=8 bits.

A first feedback path feeds the amplified residue signal $R_4$ from the last residue generating stage 110.4 to an MDAC in the $(N-3)^{th}=1^{st}$ residue generating stage 110.1, at summation node 410. A second feedback path feeds the amplified residue signal $R_4$ from the last residue generating stage 110.4 to an MDAC in the $(N-1)^{th}=3^{rd}$ residue generating stage 110.3, at summation node 216.

A low pass noise transfer function of the N residue generating stages 110.1-110.4, with optimized zero locations for an OSR of 4 is chosen for this example. The digital filter 230 can have the following exemplary transfer function:

$$D(z) = NTF(z) = (b_0 + b_1 z^{-1} + b_2 z^{-2} + \ldots + b_{N/2} z^{-N/2}) /$$
$$(G_1 G_2 \ldots G_N) = (1 + 1.8z^{-1} + z^{-2})/16 \quad \text{(Equation 10)}$$

Based on Equations 3.1-3.N/2, the gain value for the first feedback path $A_1$ is $\frac{1}{16}$ and the gain value for the second feedback path is $A_2 = -1.8/4$.

Exemplary Circuit Implementation for the Residue Generating Stage

Figure 5:
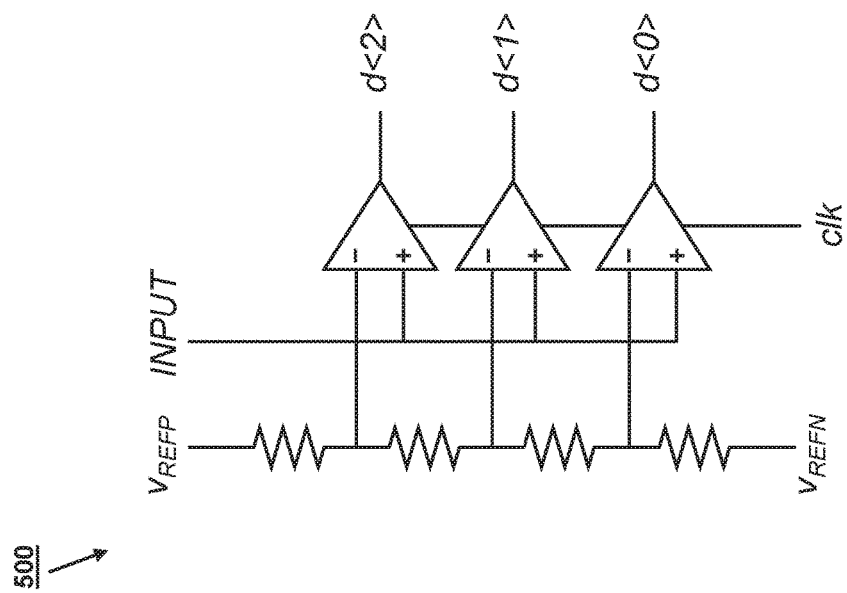
FIG. 5 shows an exemplary implementation of a flash ADC within a residue generating stage, according to some embodiments of the disclosure.

FIG. 5 shows an exemplary implementation of a flash ADC 500 within a residue generating stage, according to some embodiments of the disclosure. In this example the flash ADC 500 is a three-level flash ADC, with a digital output signal d<2:0> comprising outputs d<0>, d<1>, and d<2>. Other suitable ADC architectures can be implemented as the ADC in a given residue generating stage. The flash ADC 500 has voltage reference ladder and an array of three comparators. The voltage reference ladder has a series of resistors where ends of the series are connected to a positive reference $V_{REFP}$ and a negative reference $V_{REFN}$ respectively. The voltage reference ladder generates three reference voltages. The three comparators receive the three reference voltages respectively. A comparator, when triggered by a clock signal clk, compares the input to the stage residue generating stage against a corresponding reference voltage to generate an output based on the comparison. The comparators can generate a digital output signal d<2:0> signal having the three outputs d<0>, d<1>, and d<2>. The digital output signal d<2:0> is thus a quantized version of the input to the residue generating stage.

Figure 6:
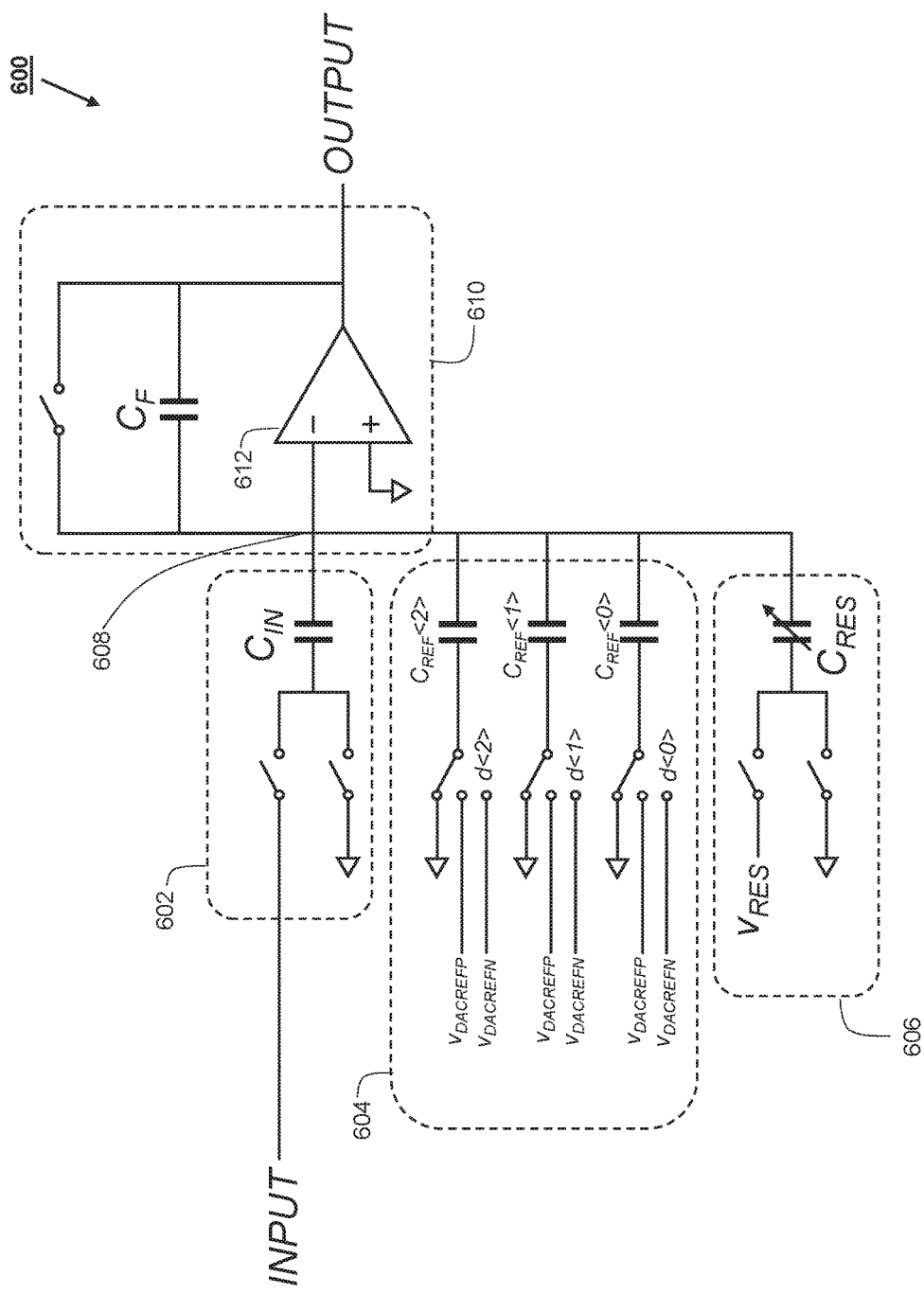
FIG. 6 shows an exemplary multiplying digital to analog converter within a residue generating stage, according to some embodiments of the disclosure.

FIG. 6 shows an exemplary MDAC 600 within a residue generating stage, according to some embodiments of the disclosure. Actual circuit implementation for the MDAC 600 can vary from one application to another, depending on the desired architecture. In this example, the MDAC 600 has sampling circuitry 602, DAC circuitry 604, feedback circuitry 606, summation node 608, and amplifier circuitry 610.

The sampling circuitry 602 receives an analog input signal to the residue generating stage, and can sample the analog input signal onto sampling capacitor $C_{IN}$. During a sampling phase, the sampling capacitor $C_{IN}$ is connected to the analog input signal. During an amplification phase, the sampling capacitor $C_{IN}$ is connected to ground.

The DAC circuitry 604 can receive the digital output signal d<2:0> from the (flash) ADC of the residue generating stage (e.g., flash ADC 500 digitizing the analog input signal), and generate a reconstructed analog input signal using DAC capacitors $C_{REF}$<2:0>. The DAC circuitry 604 can be a capacitive DAC. The digital output signal d<2:0> can selectively connect the DAC capacitors $C_{REF}$<2:0> to a first DAC voltage reference $V_{DACREFP}$, a second DAC voltage reference $V_{DACREFN}$, or ground, to generate the reconstructed analog input signal.

The feedback circuitry 606 comprises switched capacitor branches. Specifically, the feedback circuitry 606 can include a feedback injection capacitor $C_{RES}$, and switches that selectively connects the feedback injection capacitor $C_{RES}$ to a feedback voltage $V_{RES}$ or ground (or a common mode voltage). The feedback voltage is a voltage $V_{RES}$ that corresponds to the amplified residue signal $R_N$ of the Nth/last residue generating stage. The capacitance value of the feedback injection capacitor $C_{RES}$ can correspond to the gain value of a given feedback path. During the sampling phase, i.e., when the sampling circuitry 602 is sampling, the feedback injection capacitor $C_{RES}$ is connected to the feedback voltage $V_{RES}$. Accordingly, the amplified residue signal from the $N^{th}$/last residue generating stage is injected in the MDAC 600. During the amplification phase, i.e., when the amplifier circuitry 610 is amplifying, the feedback injection capacitor $C_{RES}$ is connected to ground.

Through charge redistribution of the capacitors in the MDAC 600, the summation node 608 performs subtraction of the analog input signal sampled by the sampling circuitry 602 by the reconstructed analog input signal generated by the DAC circuitry 604. Moreover, the feedback signal, i.e., the amplified residue signal $R_N$ of the Nth/last residue generating stage, through the feedback circuitry 606, is added/injected at summation node 608.

The amplifier circuitry 610 comprises an operational amplifier (opamp) 612 and feedback integrating capacitor $C_F$. The summation node 608 is at the inverting input of opamp 612. The amplifier circuitry 610 can integrate and amplify the voltage at the summation node 608, to generate an analog output signal of the residue generating stage. For this residue generating stage, the analog output signal would include an amplified version of the combined residue signal of the residue generating stage and the feedback signal from the $N^{th}$/last residue generating stage. The interstage gain G; implemented by the amplifier circuitry 610 can depend on the ratio of the feedback integrating capacitor $C_F$ and other capacitors in the MDAC 600.

As discussed previously, the gain values $A_1, A_2, \ldots$, and $A_{N/2}$ of various feedback paths to the residue generating stages can be tuned. To tune the gain values, it is possible to implement the feedback injection capacitor $C_{RES}$ in feedback circuitry 606 as a tunable capacitor. By tuning the feedback injection capacitor $C_{RES}$, it is possible to change the gain value of the feedback path, which in turn can change coefficients in the filtering component of the noise transfer function NTF(z) of the N residue generating stages. The zeros of the noise transfer function NTF(z) of the N residue generating stages, which is defined by the filter coefficients implemented by the feedback paths, can be moved through tuning of the feedback injection capacitor $C_{RES}$ in a given residue generating stage receiving feedback.

Exemplary Methods for Noise Shaping in a Pipeline ADC

Figure 7:
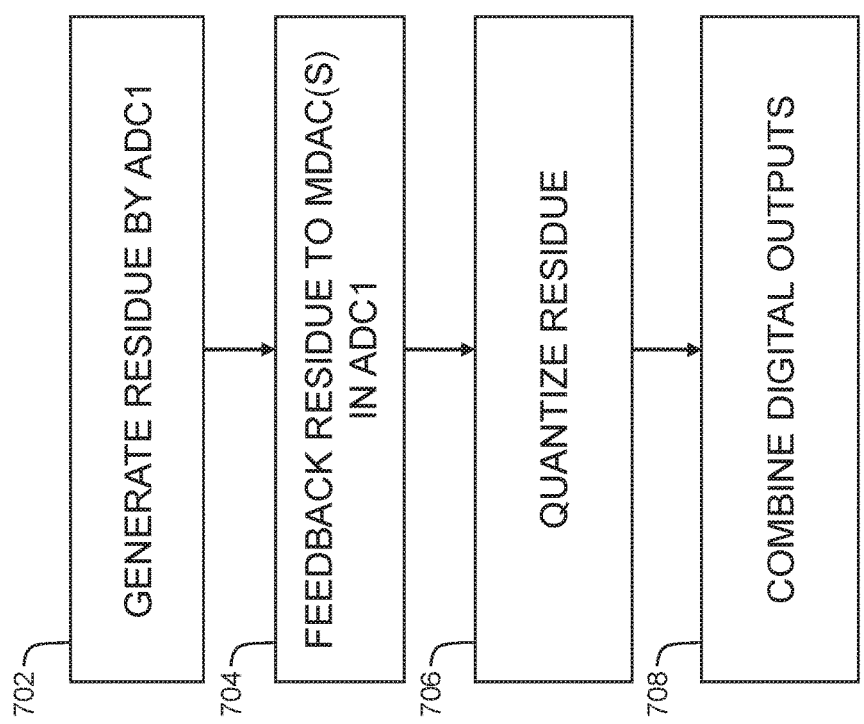
FIG. 7 is an exemplary method for noise shaping in a pipeline analog to digital converter, according to some embodiments of the disclosure.

FIG. 7 is an exemplary method for noise shaping in a pipeline analog to digital converter, according to some embodiments of the disclosure. In 702, a first ADC generates a residue signal representing a quantization error of a first ADC. In 704, one or more feedback paths feed back the residue signal of the first ADC to one or more multiplying digital to analog converters of the first analog to digital converter. In 706, a second ADC quantizes the residue signal of the first analog to digital converter. In 708, a digital signal reconstruction filter combines digital output signals of the first ADC and the second ADC to generate a final digital output signal of the pipeline analog to digital converter.

Figure 8:
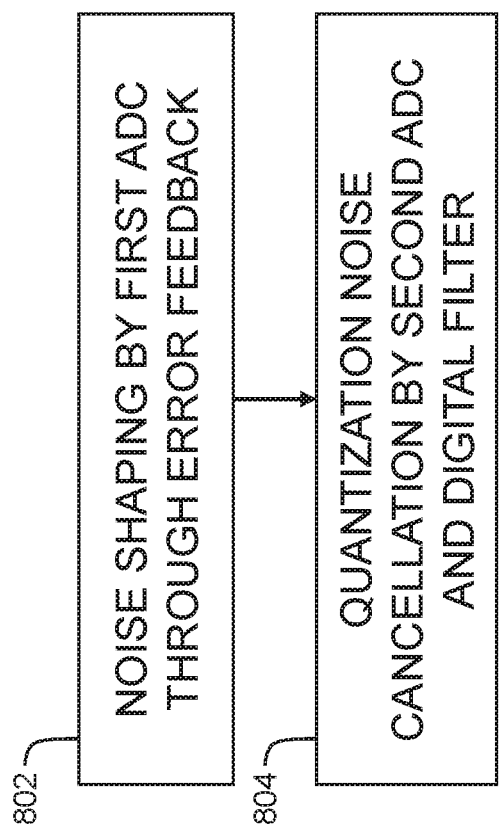
FIG. 8 is another exemplary method for noise shaping in a pipeline analog to digital converter, according to some embodiments of the disclosure.

FIG. 8 is an exemplary method for noise shaping in a pipeline analog to digital converter, according to some embodiments of the disclosure. Specifically, the method implements noise shaping of the quantization noise through the use of feedback paths in a first ADC and quantization noise cancellation through the use of a second ADC (a backend stage) and a digital filter. If desired, further noise suppression can be achieved by shaping the quantization noise of a second ADC.

In 802, the first ADC 120 uses error feedback to shape a quantization error of the first ADC 120. The first ADC 120 has N pipelined residue generating stages. Specifically, the first ADC 120 includes feedback path(s) that feeds the amplified residue signal of the $N^{th}$ residue generating stage (which corresponds to the quantization error of the first ADC 120) to selected locations as error feedback. The error feedback can be injected at a summation node of an MDAC of a residue generating stage. The N residue stages having implicit delays and the feedback path(s) effectively implements an FIR filter that filters the quantization error of the first ADC 120.

In 804, the second ADC 112 (backend converter stage) and a digital filter processing the output of the second ADC 112 enables a shaped quantization error of the first ADC 120 to be cancelled out when the digital output signals of the first ADC 120 and a filtered digital output signal of the second ADC 112 generated by the digital filter are combined. Specifically, in 804, the second ADC 112 quantizes the amplified residue signal of the $N^{th}$ residue generating stage. Moreover, in 804, a digital filter, corresponding to a noise transfer function (which includes interstage gains of the pipelined residue generating stages), filters a digital output signal of the second ADC 112 stage prior to combining the filtered digital output signal of the second ADC 112 with digital output signals of the first ADC 120 (i.e., pipelined residue generating stages). As seen previously in Equation 7, the NTF(z)Q term falls off.

If desired, the second ADC 112 can be a noise shaping ADC. In such a scenario, the quantization noise introduced by the second ADC 112 can be (further) shaped by the noise transfer function of the noise shaping ADC.

Examples

Example 1 is a noise shaping pipeline analog to digital converter, comprising: N residue generating stages; a backend stage to digitize an amplified residue signal from an Nth residue generating stage; and one or more feedback paths comprising a first feedback path to feed the amplified residue signal from the Nth residue generating stage to a multiplying digital to analog converter in a N−1th residue generating stage.

In Example 2, the noise shaping pipeline analog to digital converter of Example 1 can optionally include the one or more feedback paths comprising a second feedback path to feed the amplified residue signal from the Nth residue generating stage to a multiplying digital to analog converter in a N−kth residue generating stage.

In Example 3, the noise shaping pipeline analog to digital converter of Example 1 or 2 can optionally include k being an odd number greater than or equal to 3.

In Example 4, the noise shaping pipeline analog to digital converter of any one of Examples 1-3 can optionally include each residue generating stage having half a cycle of delay.

In Example 5, the noise shaping pipeline analog to digital converter of any one of Examples 1-4 can optionally include one of the N residue generating stages or each residue generating stage comprising: an analog to digital converter to generate a digital output signal based on an analog input signal of the residue generating stage; and a multiplying digital to analog converter to reconstruct the analog input signal based on the digital output signal, determine a difference between the reconstructed analog input signal and the analog input signal, and amplify the difference.

In Example 6, the noise shaping pipeline analog to digital converter of any one of Examples 1-5 can optionally include: a digital signal reconstruction filter to generate a final digital output signal based on digital output signals from the N residue generating stages and the backend stage.

In Example 7, the noise shaping pipeline analog to digital converter of any one of Examples 1-6 can optionally include: a digital filter to filter a digital output signal of the backend stage prior to combining a filtered digital output signal of the digital filter with digital output signals of the N residue generating stages.

In Example 8, the noise shaping pipeline analog to digital converter of Example 7 can optionally include: the digital filter corresponding to a noise transfer function of the N residue generating stages.

In Example 9, the noise shaping pipeline analog to digital converter of Example 7 or 8 can optionally include: the digital filter scaling the digital output signal of the backend stage according to interstage gains of the N residue generating stages.

In Example 10, the noise shaping pipeline analog to digital converter of any one of Examples 1-9 can optionally include: the backend stage being a delta sigma modulator.

In Example 11, the noise shaping pipeline analog to digital converter of any one of Examples 1-10 can optionally include: gain value(s) of the one or more feedback paths being selected to implement a predefined noise transfer function of the N residue generating stages.

In Example 12, the noise shaping pipeline analog to digital converter of any one of Examples 1-11 can optionally include: the one or more feedback paths comprising one or more switched capacitor branches.

In Example 13, the noise shaping pipeline analog to digital converter of any one of Examples 1-12 can optionally include: the one or more feedback paths comprising at least one tunable capacitor to adjust a noise transfer function of the N residue generating stages.

Example 14 is a method for noise shaping in a pipeline analog to digital converter, comprising: generating a residue signal representing a quantization error of a first analog to digital converter; feeding back the residue signal of the first analog to digital converter to one or more multiplying digital to analog converters of the first analog to digital converter; quantizing, by a second analog to digital converter, the residue signal of the first analog to digital converter; and combining digital output signals of the first analog to digital converter and the second analog to digital converter to generate a final digital output signal of the pipeline analog to digital converter.

In Example 15, the method of Example 14 can optionally include processing a digital output signal of the second analog to digital converter by a digital filter corresponding to a noise transfer function of first analog to digital converter.

In Example 16, the method of Example 14 or 15 can optionally include scaling the digital output signal of the second analog to digital converter by interstage gains in the first analog to digital converter.

In Example 17, the method of any one of Examples 14-16 can optionally include shaping a quantization noise of the first analog to digital converter by the second analog to digital converter.

In Example 18, the method of any one of Examples 14-17 can optionally include changing one or more gain values of one or more feedback paths to modify a noise transfer function of the first analog to digital converter.

Example 19 is a noise shaping pipeline analog to digital converter, comprising: pipelined residue generating stages, wherein a residue generating stage in the pipelined residue generating stages comprises circuitry to inject a amplified residue signal from a last pipelined residue generating stage at a summation node of an multiplying digital to analog converter of the residue generating stage; a backend stage to digitize the amplified residue signal from the last pipelined residue generating stage; and digital signal reconstruction filter to generate a final digital output signal based on digital output signals from the pipelined residue generating stages and the backend stage.

In Example 20, the noise shaping pipeline analog to digital converter of Example 19, can optionally include a digital filter (e.g., in the digital signal reconstruction filter) corresponding to a noise transfer function of the pipelined residue generating stages, the noise transfer function including interstage gains of the pipelined residue generating stages, to filter a digital output signal of the backend stage prior to combining the filtered digital output signal of the backend stage with digital output signals of the pipelined residue generating stages.

Example 21 is an apparatus comprising means for implementing and/or carrying out the methods of any one of Examples 14-18 and/or any of the functionalities described herein.

Advantages, Implementation Notes, Variations, and Applications

The architectures described herein have a variety of advantages. The feedback paths enable $N/2^{th}$ order NTF to be realized in N pipelined residue generating stages (i.e., the first ADC 120). Moreover, the shaped quantization noise can be cancelled by a second ADC 112 (a backend stage) to process the shaped quantization noise from N pipelined residue generating stages, resulting in further enhancement of SQNR. Further noise suppression can be achieved if the second ADC 112 is a noise shaping ADC. Besides, the architectures can easily allow the NTF to be tunable by varying the feedback injection capacitor(s) in the feedback paths. As such, the architectures can be particularly attractive for SDRs. Moreover, the feedback paths involving switched capacitor branches adds minor analog circuitry to a pipelined ADC. Compared with delta sigma ADCs, the architectures can offer higher bandwidth because of its low OSR and better flexibility because its NTF is tunable. Moreover, the architectures can also be configured as a Nyquist mode ADC for maximum bandwidth.

In some cases, one or more of the N residue generating stages is implemented based on a successive-approximation-register (SAR) architecture instead of a combination of a Flash ADC and an MDAC. The feedback paths can inject the residue from the $N^{th}$/last residue generating stage into one of the inputs of the residue amplifier or comparator of a SAR-based residue generating stage.

In various examples of L=N−k, k is odd. However, it is possible to also implement feedback paths to locations where k is even. The feedback injection capacitor $C_{RES}$ can be charged to a common mode voltage when the residue generating stage is sampling an input signal (sampling phase). The feedback injection capacitor $C_{RES}$ can be charged to the feedback voltage $V_{RES}$ when the residue generating stage is amplifying the residue (amplification phase).

The described architecture can be particularly suitable for applications where pipeline ADCs are used and where high bandwidth, and a high SQNR at a low OSR are important. Applications which can greatly benefit from the architecture include: instrumentation, testing, spectral analyzers, military purposes, radar, wired or wireless communications, mobile telephones, and base stations.

All of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the present disclosure, appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

The functions related to noise shaping and noise cancellation, such as the processes shown in FIGS. 7 and 8, illustrate only some of the possible functions that may be implemented/carried/executed by, or within, the circuits illustrated in the FIGURES or circuits coupled to the systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the disclosure, appended claims. Note that all optional features of the apparatus described above may also be implemented with respect to the method or process described herein and specifics in the examples may be used anywhere in one or more embodiments.

What is claimed is:

1. A noise shaping pipeline analog to digital converter, comprising:
    N residue generating stages, wherein each residue generating stage generates an amplified residue signal through summation of an analog input signal of the residue generating stage and a reconstructed analog input signal of the residue generating stage;
    a backend stage to digitize an amplified residue signal from an $N^{th}$ residue generating stage; and
    one or more feedback paths comprising a first feedback path to capacitively feed the amplified residue signal from the $N^{th}$ residue generating stage to a summation node of a multiplying digital to analog converter in a $N-1^{th}$ residue generating stage, wherein the summation node has three terminals: (1) a first terminal to receive an analog input signal of the $N-1^{th}$ residue generating stage, (2) a second terminal to receive a reconstructed analog input signal of the $N-1^{th}$ residue generating stage, and (3) a third terminal to receive the amplified residue signal of the $N^{th}$ residue generating stage.

2. The noise shaping pipeline analog to digital converter of claim 1, wherein the one or more feedback paths comprises a second feedback path to feed the amplified residue signal from the $N^{th}$ residue generating stage to a multiplying digital to analog converter in a $N-k^{th}$ residue generating stage.

3. The noise shaping pipeline analog to digital converter of claim 2, wherein k is an odd number greater than or equal to 3.

4. The noise shaping pipeline analog to digital converter of claim 1, wherein each residue generating stage has half a cycle of delay.

5. The noise shaping pipeline analog to digital converter of claim 1, wherein each residue generating stage comprises:
    an analog to digital converter to generate a digital output signal based on the analog input signal of the residue generating stage; and
    a multiplying digital to analog converter to reconstruct the analog input signal based on the digital output signal, determine a difference between the reconstructed analog input signal and the analog input signal, and amplify the difference.

6. The noise shaping pipeline analog to digital converter of claim 1, further comprising:
    digital signal reconstruction filter to generate a final digital output signal based on digital output signals from the N residue generating stages and the backend stage.

7. The noise shaping pipeline analog to digital converter of claim 1, further comprising:
    a digital filter to filter a digital output signal of the backend stage prior to combining a filtered digital output signal of the digital filter with digital output signals of the N residue generating stages.

8. The noise shaping pipeline analog to digital converter of claim 7, wherein the digital filter corresponds to a noise transfer function of the N residue generating stages.

9. The noise shaping pipeline analog to digital converter of claim 7, wherein the digital filter scales the digital output signal of the backend stage according to interstage gains of the N residue generating stages.

10. The noise shaping pipeline analog to digital converter of claim 1, wherein the backend stage is a delta sigma modulator.

11. The noise shaping pipeline analog to digital converter of claim 1, wherein gain value(s) of the one or more feedback paths are selected to implement a predefined noise transfer function of the N residue generating stages.

12. The noise shaping pipeline analog to digital converter of claim 1, wherein the first feedback path comprises a switched capacitor branch.

13. The noise shaping pipeline analog to digital converter of claim 1, wherein the first feedback paths comprises a tunable capacitor to adjust a noise transfer function of the N residue generating stages.

14. A method for noise shaping in a pipeline analog to digital converter, comprising:
    generating a residue signal representing a quantization error of a first analog to digital converter, the first analog to digital converter comprising a plurality of multiplying digital to analog converters;

feeding back, via a feedback injection capacitor, the residue signal of the first analog to digital converter to one or more summation nodes in one or more respective multiplying digital to analog converters of the first analog to digital converter;

subtracting, at each one of the one or more summation nodes to which the residue signal of the first analog to digital converter is fed, an analog input signal and a reconstructed analog input signal;

quantizing, by a second analog to digital converter, the residue signal of the first analog to digital converter; and combining digital output signals of the first analog to digital converter and the second analog to digital converter to generate a final digital output signal of the pipeline analog to digital converter.

15. The method of claim 14, further comprising:
processing a digital output signal of the second analog to digital converter by a digital filter corresponding to a noise transfer function of first analog to digital converter.

16. The method of claim 14, further comprising:
scaling the digital output signal of the second analog to digital converter by interstage gains in the first analog to digital converter.

17. The method of claim 14, further comprising:
shaping a quantization noise of the first analog to digital converter by the second analog to digital converter.

18. The method of claim 14, further comprising:
changing one or more gain values of one or more feedback paths to modify a noise transfer function of the first analog to digital converter.

19. A noise shaping pipeline analog to digital converter, comprising:
pipelined residue generating stages, wherein:
each pipelined residue generating stage comprises a summation node to generate a residue signal representing a quantization error of the pipelined residue generating stage; and
a first residue generating stage of the pipelined residue generating stages comprises a switched capacitor branch to inject an amplified residue signal from a last pipelined residue generating stage at the summation node of the first residue generating stage;
a backend stage to digitize the amplified residue signal from the last pipelined residue generating stage; and
digital signal reconstruction filter to generate a final digital output signal based on digital output signals from the pipelined residue generating stages and the backend stage.

20. The noise shaping pipeline analog to digital converter of claim 19, further comprising:
a digital filter corresponding to a noise transfer function of the pipelined residue generating stages, the noise transfer function including interstage gains of the pipelined residue generating stages, to filter a digital output signal of the backend stage prior to combining the filtered digital output signal of the backend stage with digital output signals of the pipelined residue generating stages.

* * * * *